United States Patent
Kim et al.

(10) Patent No.: US 8,050,103 B2
(45) Date of Patent: Nov. 1, 2011

(54) METHOD OF PROGRAMMING NONVOLATILE MEMORY DEVICE

(75) Inventors: You Sung Kim, Seoul (KR); Byung Ryul Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 459 days.

(21) Appl. No.: 12/361,195

(22) Filed: Jan. 28, 2009

(65) Prior Publication Data

US 2009/0296478 A1    Dec. 3, 2009

(30) Foreign Application Priority Data

May 29, 2008    (KR) .................. 10-2008-0050100

(51) Int. Cl.
*G11C 16/04*    (2006.01)
(52) U.S. Cl. .................. 365/185.24; 365/185.22
(58) Field of Classification Search ............. 365/185.24, 365/185.22
See application file for complete search history.

(56) References Cited

U.S. PATENT DOCUMENTS

| | | | | |
|---|---|---|---|---|
| 7,477,550 B2 * | 1/2009 | Son et al. | ............... | 365/185.22 |
| 2008/0123423 A1 * | 5/2008 | Kim | ................ | 365/185.11 |
| 2009/0310408 A1 * | 12/2009 | Lee et al. | ............... | 365/185.03 |

FOREIGN PATENT DOCUMENTS

KR    1020080047408 A    5/2008

OTHER PUBLICATIONS

Notice of Preliminary Rejection issued from Korean Intellectual Property Office on Oct. 29, 2009.

* cited by examiner

*Primary Examiner* — Tuan T. Nguyen
(74) *Attorney, Agent, or Firm* — IP & T Group LLP

(57) ABSTRACT

In one aspect of the method of programming a nonvolatile memory device, memory cells selected for a program are determined to belong to a first memory cell group or a second memory cell group based on address information and a program command. According to this determination, to-be-programmed data are input based on information about the number of set data bits, and programming and verification are performed.

12 Claims, 4 Drawing Sheets

METHOD OF PROGRAMMING NONVOLATILE MEMORY DEVICE

CROSS-REFERENCE TO RELATED APPLICATION

The present application claims priority to Korean patent application number 10-2008-0050100, filed on May 29, 2008, which is incorporated by reference in its entirety.

BACKGROUND OF THE INVENTION

The present invention relates to an operation of a nonvolatile memory device and, more particularly, to a method of programming a nonvolatile memory device, which can reduce an interference phenomenon by storing different numbers of bits in neighboring memory cells.

A NAND flash memory device, which is one of the well-known nonvolatile memory devices, includes a memory cell array, a row decoder, and a page buffer. The memory cell array includes a plurality of word lines arranged along rows, a plurality of bit lines arranged along columns, and a plurality of cell strings, each corresponding to a respective bit line.

A row decoder, connected to a string select line, word lines, and a common source line, is disposed on one side of the memory cell array. A page buffer connected to the bit lines, is disposed on the other side of the memory cell array.

Recently, in order to further increase the level of integration of a flash memory device, active research has been performed on multi-bit cells that are able of storing plural data in one memory cell. This type of the memory cell is called a multi-level cell (hereinafter referred to as an 'MLC'). A memory cell of a single bit corresponding to the MLC is called a single level cell (hereinafter referred to as an 'SLC').

The MLC has wider threshold voltage distributions as it can store an increased number of bits. Further, the MLC experiences an interference phenomenon in which, while a program is performed, the threshold voltage of neighboring memory cells is changed undesirably.

BRIEF SUMMARY OF THE INVENTION

The present invention is directed toward a method of programming a nonvolatile memory device, in which a program can be performed by setting the number of bits stored in neighboring memory cells differently.

A method of programming a nonvolatile memory device according to an aspect of the invention includes determining whether memory cells selected for a program belong to a first memory cell group or to a second memory cell group, based on address information input together with a program command; and receiving to-be-programmed data based on information about the number of set data bits according to the group determination, and performing programming and verification.

The programming method further includes, based on address information to distinguish the first and second memory cell groups, dividing a first word line group, which belongs to one of even and odd groups, and a second word line group, which belongs to the other of the even and odd groups; and dividing a first bit line group, which belongs to one of even and odd groups, and a second bit line group, which belongs to the other of the even and odd groups.

The division of the first memory cell group and the second memory cell group in such a way to belong to the first and second word line groups and the first and second bit line groups includes setting memory cells, which belong to the first word line group and are connected to the first bit line group, as the first memory cell group, and setting memory cells, which belong to the first word line group and are connected to the second bit line group, as the second memory cell group; and setting memory cells, which belong to the second word line group and are connected to first bit lines, as the second memory cell group, and setting memory cells, which belong to the second word line group and are connected to second bit lines, as the first memory cell group.

The memory cells belonging to the first memory cell group are memory cells that are able to store n-bit (n is an integer greater than 1) information, and the memory cells belonging to the second memory cell group are memory cells that are able to store k-bit (k is an integer greater than n) information.

A method of programming a nonvolatile memory device according to another aspect of the invention includes dividing first and second word line groups according to a word line address and first and second word line groups according to a bit line address and setting memory cells included in respective groups as SLCs and MLCs; determining whether memory cells selected for a program belong to the SLCs or the MLCs based on address information input together with a program command; and receiving to-be-programmed data according to the determination result and performing program and verification.

The division of the first and second word line groups and the first and second bit line groups includes dividing a first word line group, which belongs to one of even and odd groups, and a second word line group, which belongs to the other of the even and odd groups; and dividing a first bit line group, which belongs to one of even and odd groups, and a second bit line group, which belongs to the other of the even and odd groups.

The setting of the SLCs and the MLCs includes setting memory cells, which belong to the first word line group and are connected to the first bit line group, as the SLCs, and setting memory cells, which belong to the first word line group and are connected to the second bit line group, as the MLCs; and setting memory cells, which belong to the second word line group and are connected to first bit lines, as the MLCs, and setting memory cells, which belong to the second word line group and are connected to second bit lines, as the SLCs.

The MLCs are memory cells storing 2-bit information.

A method of a programming a nonvolatile memory device according to further aspect of the invention includes setting neighboring memory cells to store different numbers of bit information and programming the set memory cells.

The neighboring cells are divided based on bit line and word line addresses. One group of the neighboring memory cells is set to a SLC group storing 1-bit information, and the other group of the neighboring memory cells is set to a MLC group storing 2-bit information. Also, one group of the neighboring memory cells is set to a MLC group storing n-bit (n is an integer greater than 1) information, and the other group of the neighboring memory cells is set to a SLC group storing k-bit (k is an integer greater than n) information.

DESCRIPTION OF SPECIFIC EMBODIMENTS

Now, specific embodiments according to the present invention will be described with reference to the accompanying drawings. However, the invention is not limited to the disclosed embodiments, but may be implemented in various ways. The embodiments are provided to complete the disclosure of the invention and to allow those having ordinary skill in the art to understand the scope of the invention. The invention is defined by the claims.

Figure 1A:
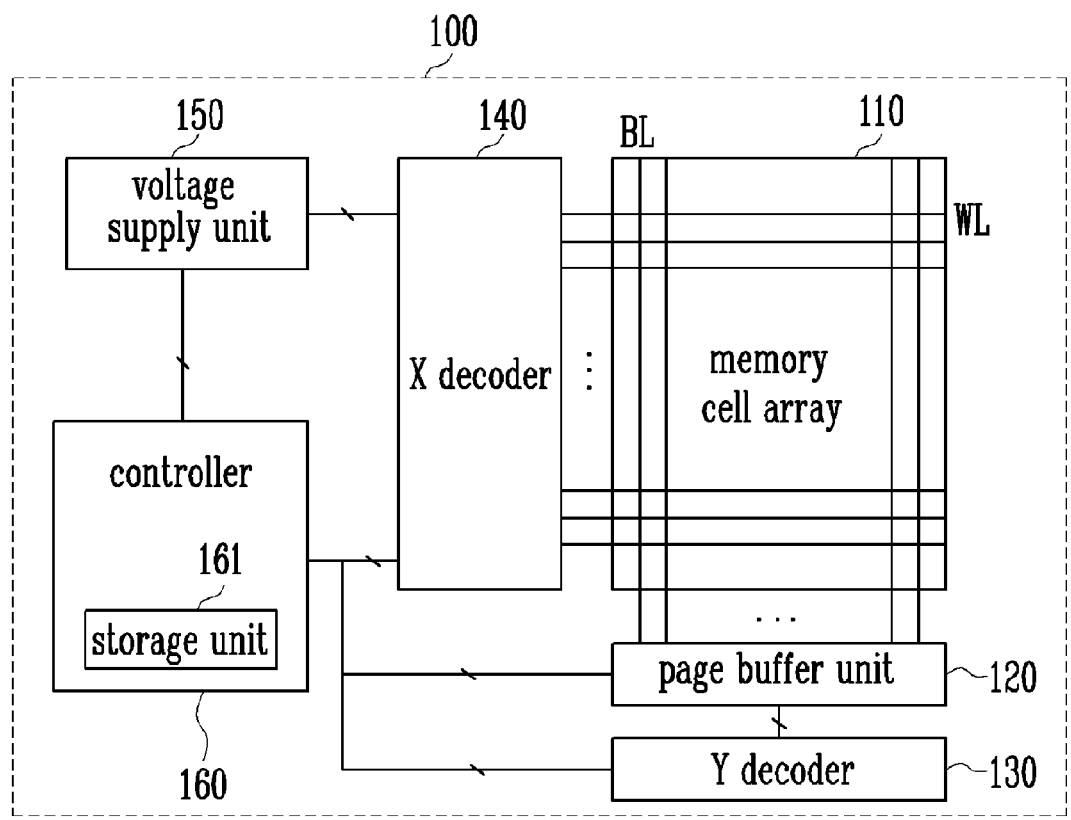
FIG. 1A is a block diagram of a nonvolatile memory device in accordance with an embodiment of the present invention.

FIG. 1A is a block diagram of a nonvolatile memory device in accordance with an embodiment of the invention. Referring to FIG. 1A, a nonvolatile memory device 100 includes a memory cell array 110, a page buffer unit 120, a Y decoder 130, an X decoder 140, a voltage supply unit 150, and a controller 160.

The memory cell array 110 includes a plurality of memory cells for data storage. The memory cells are constituted on a memory-block basis and are connected by bit lines and word lines.

The page buffer unit 120 is connected to the bit lines of the memory cell array 110. The page buffer unit includes page buffer circuits for temporarily storing to-be-programmed data in a selected memory cell or reading and latching data programmed in a selected memory cell.

The Y decoder 130 provides a data I/O path of the page buffer circuits. The X decoder 140 enables the memory blocks of the memory cell array 110, and connects global word lines for operating voltages and word lines of an enabled memory block.

The voltage supply unit 150 generates the operating voltages applied to the global word lines. The controller 160 controls an operation of the page buffer unit 120, the Y decoder 130, the X decoder 140, and the voltage supply unit 150.

In particular, the controller 160 checks word line and bit line addresses of a memory cell, determines whether a corresponding memory cell will be programmed as an SLC or an MLC, which is able to store 2-bit data, and controls program and read operations according to the SLC or MLC status of the cell. The controller 160 includes a storage unit 161 for storing information to indicate whether a memory cell is an SLC or an MLC according to an address.

Figure 1B:
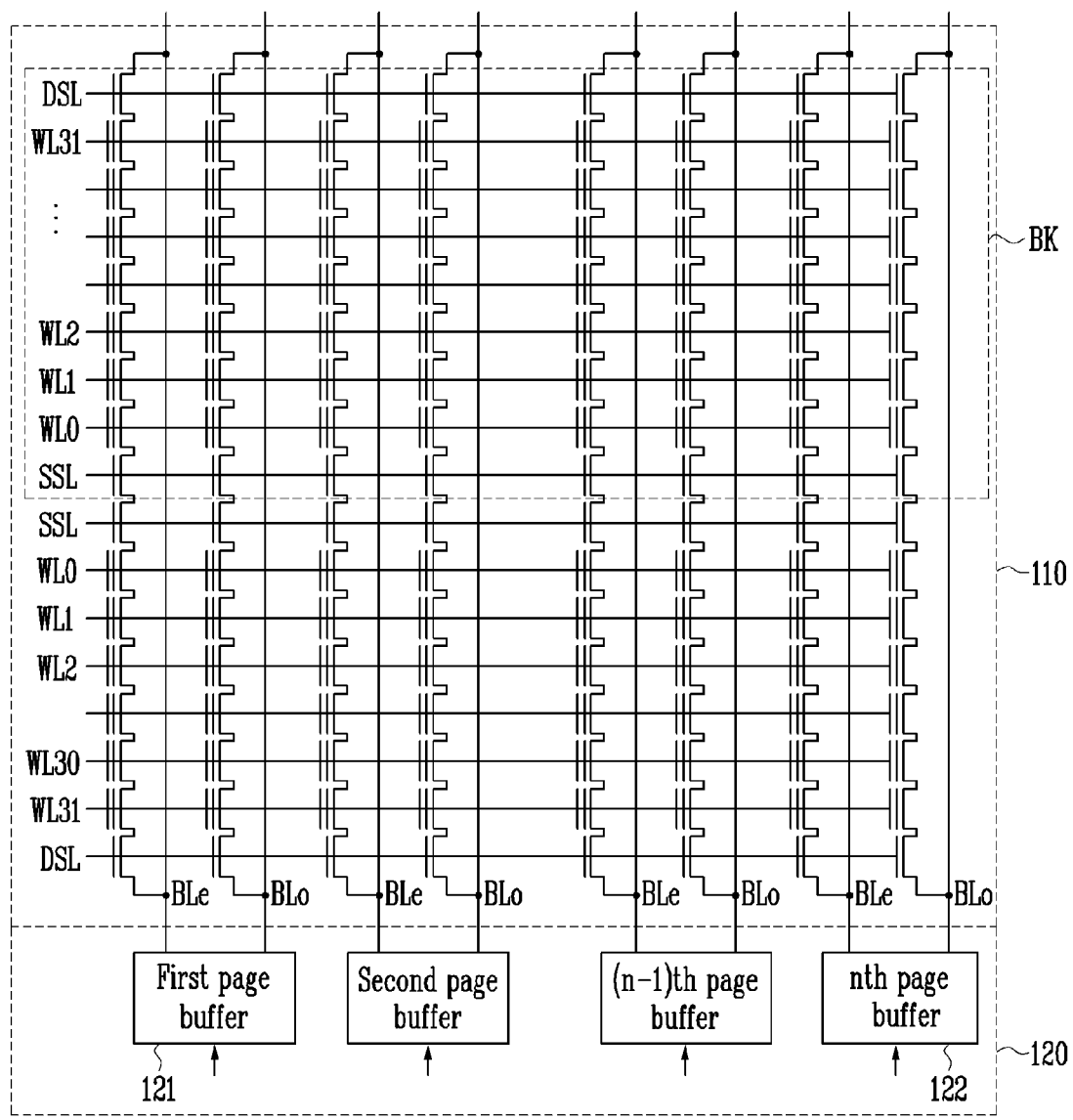
FIG. 1B is a circuit diagram of a memory cell array shown in FIG. 1A.

FIG. 1B is a circuit diagram of the memory cell array shown in FIG. 1A. Referring to FIG. 1B, the memory cell array 110 includes memory blocks BK. Each of the memory blocks BK includes a plurality of cell strings. Each of the cell strings has memory cells connected in series between a drain select transistor and a source select transistor. The memory cells are programmed as an SLC, which is able to store 1-bit data, or an MLC, which is able to store 2-bit data, if appropriate.

The gates of the drain select transistors are connected to a drain select line DSL, and the gates of the source select transistors are connected to a source select line SSL. Further, the memory cells are connected to the word lines numbered 0 to 31 (WL<0:31>).

The bit lines are connected to the other terminals of the drain select transistors of the cell strings. The bit lines are divided into even bit lines BLe and odd bit lines BLo.

The page buffer unit 120 includes first to $n^{th}$ page buffers 121. Each of the page buffers is connected a pair of the even bit line BLe and the odd bit line BLo. Here, the page buffer includes a circuit having three latches in order to store 2-bit data.

A nonvolatile memory device in accordance with an embodiment of the invention is configured to perform program and read operations by distinguishing the characteristics of memory cells based on word line and bit line addresses as follows when a program is performed.

Figure 2:
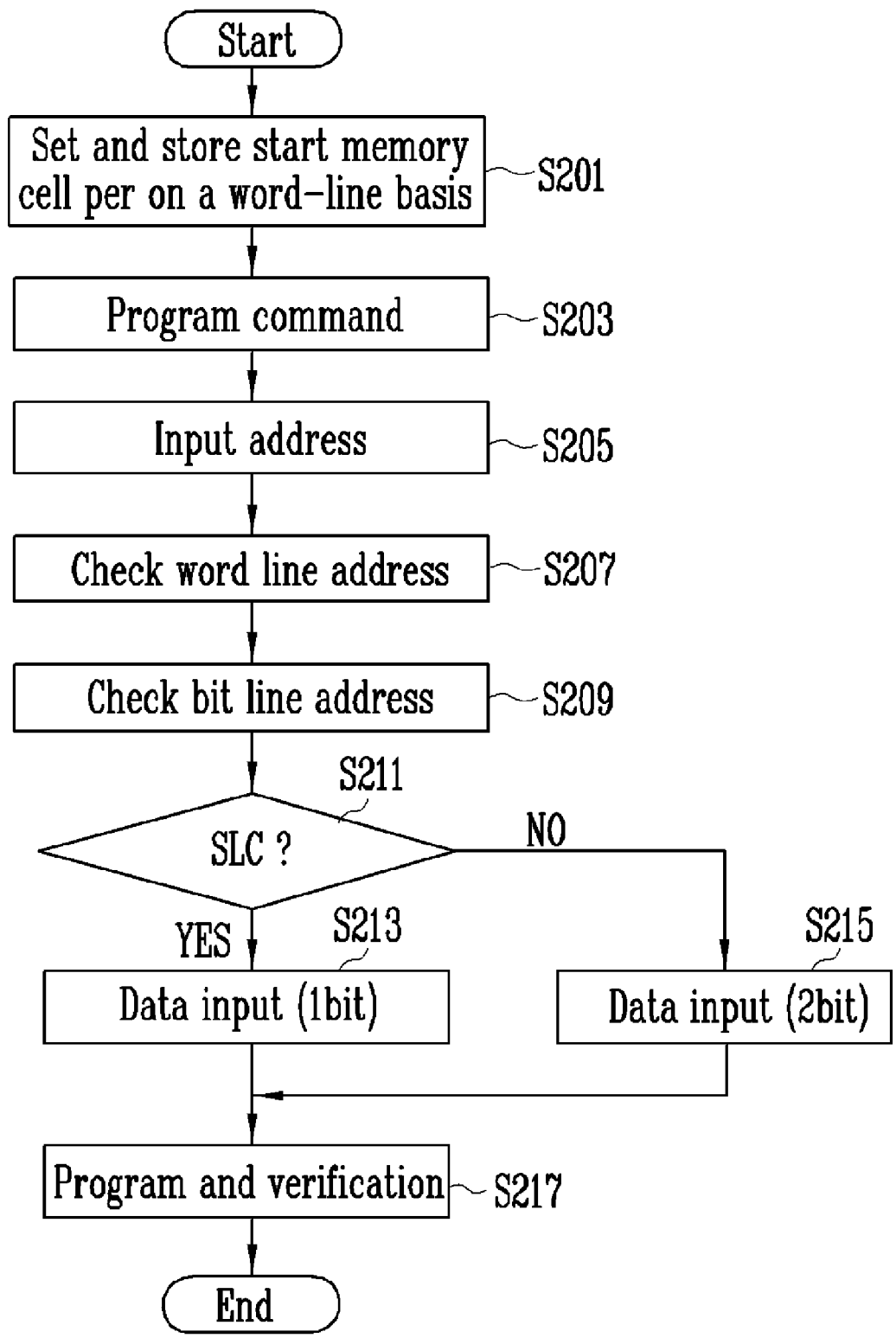
FIG. 2 is a flowchart illustrating a program operation in accordance with an embodiment of the invention.

FIG. 2 is a flowchart illustrating a program operation in accordance with an embodiment of the invention. Referring to FIG. 2, first, the controller 160 of the nonvolatile memory device 100 according to an embodiment of the invention stores memory cell set information about whether a corresponding memory cell will be programmed as an SLC or MLC on a word-line and bit-line basis in step S201.

The memory cell set information can be stored as listed in Table below.

TABLE

|  | BLe | BLo |
|---|---|---|
| WL<0> | SLC | MLC |
| WL<1> | MLC | SLC |
| WL<2> | SLC | MLC |
| ... | ... | ... |
| WL<31> |  | SLC |

The Table illustrates that, when word lines are selected, the state of a memory cell, which has to be programmed for the first time, is set.

More particularly, when one word line is programmed, a nonvolatile memory device first selects and programs the even bit line BLe and then programs the odd bit line BLo.

That is, when each word line is selected, the even bit line BLe of a corresponding word line is first programmed and the odd bit line BLo of the corresponding word line is then programmed. Thus, when a cell is first programmed on a word-line basis, it is determined which one of an SLC and an MLC will be selected and the other of the cell is programmed differently.

In other words, when the 0-word line WL<0> is selected, an SLC is first programmed. It is intended that memory cells connected to the even bit line BLe of the 0-word line WL<0> are programmed as an SLC. If the even bit line BLe is programmed as n SLC, the odd bit line BLo is programmed as an MLC.

In a similar way, when the first word line WL<1> is selected, the even bit line BLe is programmed as an MLC and the odd bit line BLo is programmed as an SLC. Information set as described above is stored in the storage unit 161 of the controller 160.

Next, a program command is input in step S203, and information about an address to be programmed is input in step S205. Information about a word line of the input address information is checked in step S207, and a bit line address is checked in step S209.

If the input information is an address of the second word line WL<2> and the even bit line BLe is selected, it is determined whether a memory cell will be programmed as an SLC in step S211.

If, as a result of the determination, the memory cell is determined to be programmed as an SLC, data to be programmed is input to the page buffer in step S213. Here, each page buffer stores 1-bit data.

If, as a result of the determination, the memory cell is determined to be programmed as an MLC, the controller 160 stores program data of two bits in each page buffer in step S215. That is, two bit data is latched in one page buffer.

After data is stored in each page buffer according to each set address in step S213 or S215, the data is programmed into the memory cell through program and verification in step S217.

The program method is performed using a general SLC program method or a general MLC program method. In the above embodiment, the SLC program method of storing 1-bit data and the MLC program method of storing 2-bit data are alternately performed such that different pieces of bit information are programmed into neighboring memory cells.

Figure 3:
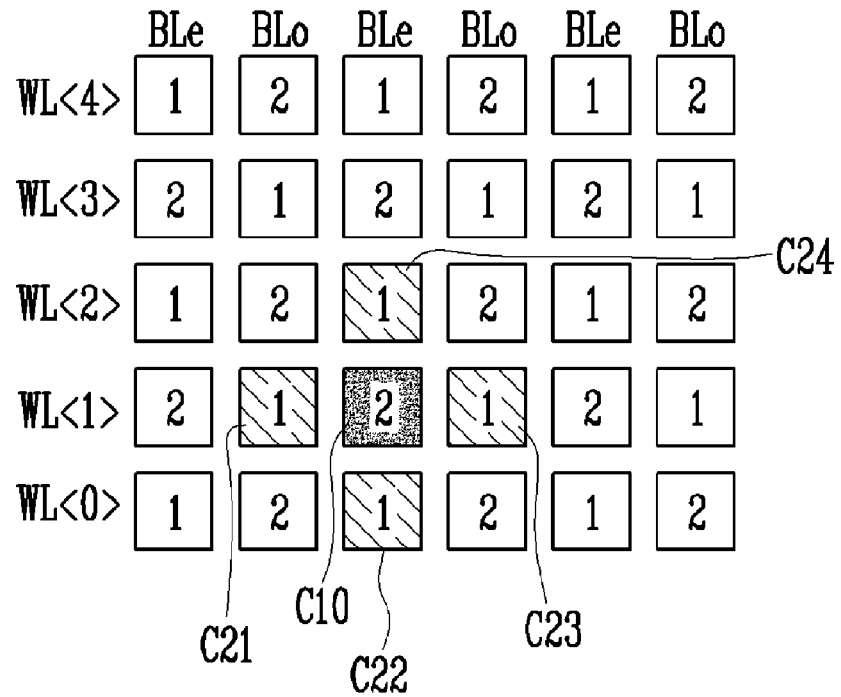
FIG. 3 is a block diagram showing the configuration of a memory cell, which has been programmed according to the operation of FIG. 2.

FIG. 3 is a block diagram showing the configuration of a memory cell, which has been programmed according to the operation of FIG. 2. FIG. 3 shows a part of the memory cell array and illustrates the types of memory cells, which are programmed every number 0 to number 4 word lines WL<0:4>, even bit lines BLe and odd bit lines BLo.

In FIG. 3, a cell C10 is an MLC that is able to store 2 bits, and peripheral cells C21 to C24 thereof are SLCs. As described above, since the neighboring memory cells can store small bit information, the cell C10 less experiences an interference phenomenon as compared with a case where the cell C10 is surrounded by 2-bit MLCs.

Of course, an SLC can be surrounded by 2-bit MLCs, but experiences an interference phenomenon relatively less often when compared with a 2-bit MLC. Accordingly, this is not a problem.

Further, if a memory cell is programmed as in the above-described embodiment of the invention, the program time can be shortened as compared with a case where the entire memory cells are programmed as 2-bit MLCs. This is because the program time of an SLC is shorter than that of a 2-bit MLC.

In the above embodiment, it has been described that one memory cell is programmed as an SLC and other memory cells are programmed as 2-bit MLCs. However, it is to be understood that the memory cells can be programmed as MLCs which can store different pieces of bit information.

For example, the invention can be applied to a method of alternately programming 2-bit MLCs and 3-bit MLCs. Even in this case, the program time can be shortened and the interference phenomenon can be decreased.

Figure 4:
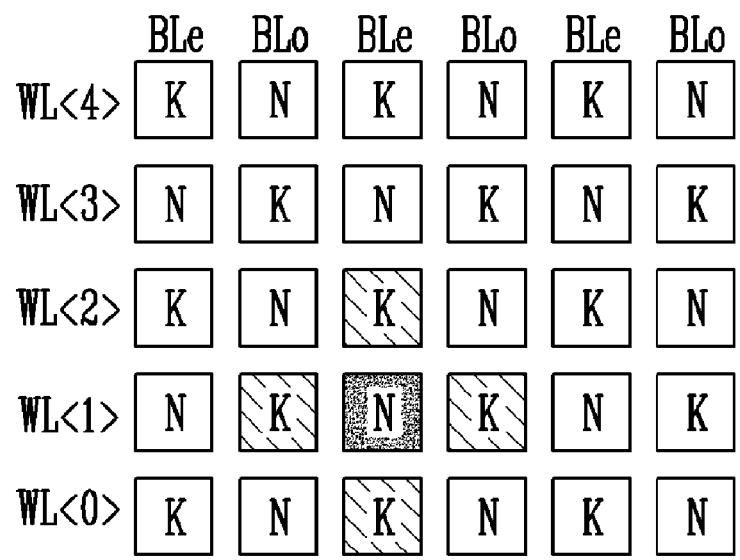
FIG. 4 is a block diagram showing the configuration of a memory cell, which has been programmed in accordance with another embodiment of the invention.

FIG. 4 is a block diagram showing the configuration of a memory cell, which has been programmed in accordance with another embodiment of the invention. Referring to FIG. 4, in odd word lines, a memory cell connected to an even bit line is programmed as an MLC, which stores k bits, and a memory cell connected to an odd bit line is programmed as an MLC, which stores n bits.

Further, in even word lines, a memory cell connected to an even bit line is programmed as an MLC, which stores n bits, and a memory cell connected to an odd bit line is programmed as an MLC, which stores k bits. Here, 'n' is an integer greater than 1 and 'k' is an integer greater than 'n'.

If a program is performed as shown in FIG. 4, the number of bits stored in neighboring memory cells differ. Accordingly, there is an advantage in that the influence of a specific memory cell on neighboring cells when a program operation is performed can be distributed.

As described above, in accordance with the programming method of the invention, the numbers of bits stored in neighboring memory cells are controlled differently. Accordingly, an interference phenomenon between memory cells can be reduced.

The embodiments disclosed herein have been proposed to allow a person skilled in the art to easily implement the invention, and the person skilled in the part may implement the invention by a combination of these embodiments. Therefore, the scope of the invention is not limited by or to the embodiments described above, and should be construed to be defined only by the appended claims.

What is claimed is:

1. A method of programming a nonvolatile memory device, comprising:
   determining whether memory cells selected for a program belong to a first memory cell group or a second memory cell group based on address information together with a program command; and
   receiving to-be-programmed data based on information about the number of set data bits according to a result of said determining and performing programming and verification.

2. The programming method of claim 1, further comprising, based on address information to distinguish the first and second memory cell groups, (a) dividing a first word line group, which belongs to one of even and odd groups, and a second word line group, which belongs to the other of the even and odd groups, and (b) dividing a first bit line group, which belongs to one of even and odd groups, and a second bit line group, which belongs to the other of the even and odd groups.

3. The programming method of claim 2, wherein the division of the first memory cell group and the second memory cell group in such a way to belong to the first and second word line groups and the first and second bit line groups includes
   setting memory cells, which belong to the first word line group and are connected to the first bit line group, as the first memory cell group, and setting memory cells, which belong to the first word line group and are connected to the second bit line group, as the second memory cell group, and
   setting memory cells, which belong to the second word line group and are connected to first bit lines, as the second memory cell group, and setting memory cells, which belong to the second word line group and are connected to second bit lines, as the first memory cell group.

4. The programming method of claim 3, wherein:
   the memory cells belonging to the first memory cell group are memory cells that are able to store n-bit information, n being an integer greater than 1, and
   the memory cells belonging to the second memory cell group are memory cells that are able to store k-bit information, k being an integer greater than n.

5. A method of programming a nonvolatile memory device, the method comprising:
   dividing first and second word line groups according to a word line address and first and second word line groups according to a bit line address, and setting memory cells included in respective groups as single level cells (SLCs) and multi-level cells (MLCs);
   determining whether memory cells selected for a program belong to the SLCs or the MLCs based on address information together with a program command; and
   receiving to-be-programmed data according to a result of said determining, and performing programming and verification.

6. The programming method of claim 5, wherein the division of the first and second word line groups and the first and second bit line groups includes dividing a first word line group, which belongs to one of even and odd groups, and a second word line group, which belongs to the other of the even and odd groups; and dividing a first bit line group, which belongs to one of even and odd groups, and a second bit line group, which belongs to the other of the even and odd groups.

7. The programming method of claim 6, wherein the setting of the SLCs and the MLCs includes setting memory cells, which belong to the first word line group and are connected to the first bit line group, as the SLCs, and setting memory cells, which belong to the first word line group and are connected to the second bit line group, as the MLCs, and setting memory cells, which belong to the second word line group and are connected to first bit lines, as the MLCs, and setting memory cells, which belong to the second word line group and are connected to second bit lines, as the SLCs.

8. The programming method of claim 7, wherein the MLCs are memory cells storing 2-bit information.

9. A method of programming a nonvolatile memory device, comprising setting neighboring memory cells to store a different number of bit information and programming the set memory cells.

10. The programming method of claim 9, wherein the neighboring cells are divided based on bit line and word line addresses.

11. The programming method of claim 9, wherein one group of the neighboring memory cells is set to a SLC group storing 1-bit information, and the other group of the neighboring memory cells is set to a MLC group storing 2-bit information.

12. The programming method of claim 9, wherein one group of the neighboring memory cells is set to a MLC group storing n-bit information, n being an integer greater than 1, and the other group of the neighboring memory cells is set to a SLC group storing k-bit information. k being an integer greater than n.

* * * * *